US009179143B2

(12) United States Patent
Streater (10) Patent No.: US 9,179,143 B2
(45) Date of Patent: *Nov. 3, 2015

(54) COMPRESSED VIDEO (71) Applicant: Forbidden Technologies PLC, London (GB)

(72) Inventor: Stephen Bernard Streater, London (GB)

(73) Assignee: Forbidden Technologies PLC, London (GB)

( * ) Notice: Subject to any disclaimer, the term of this patent is extended or adjusted under 35 U.S.C. 154(b) by 0 days.

This patent is subject to a terminal disclaimer.

(21) Appl. No.: 14/216,309

(22) Filed: Mar. 17, 2014

(65) Prior Publication Data

US 2014/0198843 A1   Jul. 17, 2014

Related U.S. Application Data

(63) Continuation of application No. 10/578,276, filed as application No. PCT/GB2004/004758 on Nov. 10, 2004, now Pat. No. 8,711,944.

(30) Foreign Application Priority Data

Nov. 10, 2003 (GB) .................................. 0326201.1

(51) Int. Cl.
*H04N 7/12* (2006.01)
*H04N 11/02* (2006.01)
(Continued)

(52) U.S. Cl.
CPC ........... *H04N 19/00121* (2013.01); *H03M 7/40* (2013.01); *H04N 19/13* (2014.11); *H04N 19/136* (2014.11); *H04N 19/1887* (2014.11); *H04N 19/507* (2014.11); *H04N 19/51* (2014.11); *H04N 19/593* (2014.11); *H04N 19/94* (2014.11)

(58) Field of Classification Search
USPC ...................................................... 375/240.24
See application file for complete search history.

(56) References Cited

U.S. PATENT DOCUMENTS 5,057,932 A    10/1991   Lang
5,717,394 A *   2/1998   Schwartz et al. ............... 341/51
(Continued)

FOREIGN PATENT DOCUMENTS

DE        10358846        7/2005
JP        11-341498       12/1999
(Continued)

OTHER PUBLICATIONS

Shanableh et al., "Heterogeneous Video Transcoding to Lower Spatio-Temporal Resolutions and Different Encoding Formats", IEEE Transactions on Multimedia, vol. 2, No. 2, Jun. 2000, pp. 101-110.

(Continued)

*Primary Examiner* — Hee-Yong Kim
(74) *Attorney, Agent, or Firm* — Fay Sharpe LLP (57) ABSTRACT

A method of compressing digital data comprising the steps of:
  (i) reading digital data as series of binary coded words representing a context and a codeword to be compressed;
  (ii) calculating distribution output data for the input data and assigning variable length codewords to the result; and
  (iii) periodically recalculating the codewords in accordance with a predetermined schedule, in order to continuously update the codewords and their lengths.

4 Claims, 5 Drawing Sheets

(51) Int. Cl.

| | | |
|---|---|---|
| *H04N 11/04* | (2006.01) | |
| *H03M 7/34* | (2006.01) | |
| *H03M 7/40* | (2006.01) | |
| *H04N 19/13* | (2014.01) | |
| *H04N 19/51* | (2014.01) | |
| *H04N 19/593* | (2014.01) | |
| *H04N 19/136* | (2014.01) | |
| *H04N 19/94* | (2014.01) | |
| *H04N 19/507* | (2014.01) | |
| *H04N 19/169* | (2014.01) | |

(56) References Cited

U.S. PATENT DOCUMENTS

| | | | |
|---|---|---|---|
| 5,754,239 A | | 5/1998 | Wilkinson |
| 5,757,382 A | | 5/1998 | Lee |
| 5,969,650 A | * | 10/1999 | Wilson .......................... 341/67 |
| 6,020,924 A | | 2/2000 | Jahanghir |
| 6,195,128 B1 | | 2/2001 | Streater |
| 7,197,070 B1 | | 3/2007 | Zhang et al. |
| 8,660,181 B2 | | 2/2014 | Streater |
| 2003/0091000 A1 | | 5/2003 | Chu et al. |
| 2003/0156651 A1 | | 8/2003 | Streater et al. |
| 2003/0167472 A1 | | 9/2003 | Barbanson et al. |
| 2003/0169816 A1 | | 9/2003 | Wang et al. |
| 2005/0180646 A1 | | 8/2005 | Denoual et al. |
| 2006/0088094 A1 | | 4/2006 | Cieplinski et al. |
| 2007/0126611 A1 | | 6/2007 | Streater |

FOREIGN PATENT DOCUMENTS

| | | |
|---|---|---|
| WO | WO 95/16325 | 6/1995 |
| WO | WO 97/08899 | 3/1997 |
| WO | WO 02/05561 | 1/2002 |

OTHER PUBLICATIONS

Jung et al., "Multithreaded Distributed MPEG1-Video Delivery in the Internet Environment", Proceedings of the 2000 ACM Symposium on Applied Computing (SAC '00), Mar. 19-21, 2000, pp. 592-597.

* cited by examiner

FIG. 7
Cuts encoding

FIG. 8
Delta encoding

FIG. 9

COMPRESSED VIDEO

This application is a continuation of U.S. application Ser. No. 10/578,276 which was filed on Jan. 17, 2007 and is still pending. That application, in turn, was the entry into the national phase of International Application No. PCT/GB2004/004758 which was filed on Nov. 10, 2004. That application, in turn, claimed priority to British Application No. 0326201.1 which was filed on Nov. 10, 2003.

This invention relates to a method of processing of digital video information. This digital video information is either compressed for storage and then later transmission, or is compressed and transmitted live with a small latency. Transmission is for example over the internet.

There is a need for highly efficient compression techniques to be developed to enable transmission of video in real time over the internet because of the restrictions in the bandwidth. In addition, the increasing need for high volume of content and rising end-user expectations mean that a market is developing for live compression at high frame rate and image size.

An object of the invention is to provide such compression techniques.

GENERAL BACKGROUND

The video to be compressed can be considered as consisting of a number of frames (at least 1), each made up of individual picture elements, or pixels. Each pixel can be represented by three components, usually either RGB (red, green and blue) or YUV (luminance and two chrominance values). These components can be any number of bits each, but eight bits of each is usually considered sufficient.

The human eye is more sensitive to the location of edges in the Y values of pixels than the location of edges in U and V. For this reason, the preferred implementation here used the YUV representation for pixels.

The image size can vary, with more pixels giving higher resolution and higher quality, but at the cost of higher data rate. Where the source video is in PAL format, the image fields have 288 lines with 25 frames per second. Square pixels give a source image size of 384×288 pixels. The preferred implementation has a resolution of 376×280 pixels using the central pixels of a 384×288 pixel image, in order to remove edge pixels which are prone to noise and which are not normally displayed on a TV set.

The images available to the computer generally contain noise so that the values of the image components fluctuate. These source images are filtered as the first stage of the compression process. The filtering reduces the data rate and improves the image quality of the compressed video.

A further stage analyses the contents of the video frame-by-frame and determines which of a number of possible types pixel should be allocated to. These broadly correspond to pixels in high contrast areas and pixels in low contrast areas.

The pixels are hard to compress individually, but there are high correlations between each pixel and its near neighbours. To aid compression, the image is split into one of a number of different types of components. The simpler parts of the image split into rectangular components, called "super-blocks" in this application, which can be thought of as single entities with their own structure. These blocks can be any size, but in the preferred implementation described below, the super-blocks are all the same size and are 8×8 pixel squares. More structurally complex parts of the image where the connection between pixels further apart is less obvious are split up into smaller rectangular components, called "mini-blocks" in application.

It is apparent that if each super-block is compressed separately, the errors resulting from the compression process can combine across edges between super-blocks thus illustrating the block-like nature of the compression by highlighting edges between blocks, which is undesirable. To avoid this problem, the mini-blocks are tokenised with an accurate representation and these are compressed in a loss free way.

Each super-block or mini-block is encoded as containing YUV information of its constituent pixels.

This U and V information is stored at lower spatial resolution than the Y information, in one implementation with only one value of each of U and V for every mini-block. The super-blocks are split into regions. The colour of each one of these regions is represented by one UV pair.

Real Time Filtering

The aim is to remove noise from the input video, as noise is by definition hard to compress. The filtering mechanism takes frames one at a time. It compares the current frame with the previous filtered frame on a pixel-by-pixel basis. The value for the previous pixel is used unless there is a significant difference. This can occur in a variety of ways. In one, the value of the pixel in the latest frame is a long way from the value in the previous filtered frame. In another, the difference is smaller, but consistently in the same direction. In another, the difference is even smaller, but cumulatively, over a period of time, has tended to be in the same direction. In these the first two cases, the pixel value is updated to the new value. In the third case, the filtered pixel value is updated by a small amount in the direction of the captured video. The allowable error near a spatial edge is increased depending on the local contrast to cut out the effects of spatial jitter on the input video.

Real time motion estimation

The video frames are filtered into "Noah regions". Thus the pixels near to edges are all labelled. In a typical scene, only between 2% and 20% of the pixels in the image turn out to have the edge labelling. There are three types of motion estimation used. In the first, whole frame pan detection using integer number of pixels is implemented. These motions can be implemented efficiently over the whole image on playback as pixels can be copied to new locations and no blurring is needed. This uses the edge areas from the Noah regions only as the edges contain the information needed for an accurate motion search. The second is sub-pixel motion removal over the whole image. This uses the edge areas from the Noah regions only as the edges contain the information needed for an accurate motion search. The edge pixels in the image, estimated by example from the Noah filtering stage, are matched with copies of themselves with translations of up to e.g., 2 pixels, but accurate to e.g., 1/64 pixel (using a blurring function to smooth the error function) and small rotations. The best match is calculated by a directed search starting at a large scale and increasing the resolution until the required sub-pixel accuracy is attained. This transformation is then applied in reverse to the new image frame and filtering continues as before. These changes are typically ignored on playback. The effect is to remove artefacts caused by camera shake, significantly reducing datarate and giving an increase in image quality. The third for examines local areas of the image. Where a significant proportion of the pixels are updated, for example on an 8×8 pixel block, either motion vectors are tested in this area with patches for the now smaller temporal deltas, or a simplified super-block representation is used giving either 1 or 2 YUVs per block, and patches are made to this.

Real Time Fade Representation

The encoding is principally achieved by representing the differences between consecutive compressed frames. In some cases, the changes in brightness are spatially correlated. In this case, the image is split into blocks or regions, and codewords are used to specify a change over the entire region, with differences with these new values rather than differences to the previous frame itself being used.

Segment Noah Regions—Find Edges

A typical image consists of areas with low contrast and areas of high contrast, or edges. The segmentation stage described here analyses the image and decides whether any pixel is near an edge or not. It does this by looking at the variance in a small area containing the pixel. For speed, in the current implementation, this involves looking at a 3×3 square of pixels with the current pixel at the centre, although future implementations on faster machines can be expected to look at a larger area. The pixels which are not near edges are compressed using an efficient but simple representation which includes multiple pixels—for example 2×2 blocks or 8×8 blocks, which are interpolated on playback. The remaining pixels near edges are represented as either e.g., 8×8 blocks with a number of YUV areas (typically 2 or 3) if the edge is simply the boundary between two or more large regions which just happen to meet here, or as 2×2 blocks with 1 Y and one UV per block in the case that the above simple model does not apply e.g., when there is too much detail in the area because the objects in this area are too small.

Miniblockify

The image is made up of regions, which are created from the Noah regions. The relatively smooth areas are represented by spatially relatively sparse YUV values, with the more detailed regions such as the Noah edges being represented by 2×2 blocks which are either uniform YUV, or consist of a UV for the block and maximum Y and a minimum Y, with a codeword to specify which of the pixels in the block should be the maximum Y value and which should be the minimum. To further reduce the datarate, the Y pairs in the non-uniform blocks are restricted to a subset of all possible Y pairs which is more sparse when the Y values are far apart.

Transitions with Variable Lengths Codewords

Compressing video consists in part of predicting what the next frame will as accurately as possible from the available data, or context. Then the (small) unpredictable element is what is sent in the bitstream, and this is combined with the prediction to give the result. The transition methods described here are designed to facilitate this process. On compression, the available context and codeword to compress are passed to the system. This then adds this information to its current distribution (which it is found performs well when it starts with no prejudice as the likely relationship between the context and the output codeword). The distribution output data for this context is calculated and variable length codewords assigned to the outcomes which have arisen. These variable length codewords are not calculated each time the system is queried as the cost/reward ratio makes it unviable, particularly as the codewords have to be recalculated on the player at the corresponding times they are calculated on the compressor. Instead, the codewords are recalculated from time to time. For example, every new frame, or every time the number of codewords has doubled. Recalculation every time an output word is entered for the first time is too costly in many cases, but this is aided by not using all the codeword space every time the codewords are recalculated. Codeword space at the long end is left available, and when new codewords are needed then next one is taken. As these codewords have never occurred up to this point, they are assumed to be rare, and so giving them long codewords is not a significant hindrance. When the codeword space is all used up, the codewords are recalculated. The minimum datarate for Huffman codewords is a very flat and wide minimum, so using the distribution from the codewords which have occurred so far is a good approximation to the optimal. Recalculating the codewords has to happen quickly in a real time system. The codewords are kept sorted in order of frequency, with the most frequent codewords first. The sorting is a mixture of bin sort using linked lists which is O(n) for the rare codewords which change order quite a lot, and bubble sort for the common codewords which by their nature to not change order by very much each time a new codeword is added. The codewords are calculated by keeping a record of the unused codeword space, and the proportion of the total remaining codewords the next data to encode takes. The shorted codeword when the new codeword does not exceed its correct proportion of the available codeword space is used. There is are further constraints—in order to keep the codes as prefix codes and to allow spare space for new codewords, codewords never get shorter in length, and each codeword takes up an integer power of two of the total codeword space. This method creates the new codewords into a lookup table for quick encoding in O(n) where n is the number of sorted codewords.

Memory Management

To facilitate Java playback, all the memory used is allocated in one block at the start. As garbage collection algorithms on Java virtual machines are unpredictable, and many stop the system for periods which are long in comparison to the length of a video frame, the invention may use its own memory management system. This involves allocating enough memory for e.g., 2 destination codewords for each source codeword when it is first encountered. New transitions are added as and when they occur, and when the available space for them overflows, the old memory is ignored, and new memory of twice the size is allocated. Although up to half the memory may end up unused, the many rare transitions take almost no memory, and the system scales very well and makes no assumption about the distribution of transitions.

Give Compressed Codeword for this Uncompressed Codeword

Every time a codeword occurs in a transition for the second or subsequent time, its frequency is updated and it is re-sorted. When it occurs for the first time in this transition however, it must be defined. As many codewords occur multiple times in different transitions, the destination value is encoded as a variable length codeword each time it is used for the first time, and this variable length codeword is what is sent in the bitstream, preceded by a "new local codeword" header codeword. Similarly, when it occurs for the first time ever, it is encoded raw preceded by a "new global codeword" header codeword. These header codewords themselves are variable length and recalculated regularly, so they start off short as most codewords are new when a new environment is encountered, and they gradually lengthen as the transitions and concepts being encoded have been encountered before.

Video Compression (Cuts)

Cuts are compressed using spatial context from the same frame.

Cuts, RLE uniform shape, else assume independent and context=CUT_CW.

Cuts->editable, so needs efficient. First approximation at lower resolution e.g., 8×8.

Cuts—predict difference in mini-block codewords from previous one and uniform flag for current one.

Video Compression (Deltas)

The deltas can use temporal and spatial context.

Deltas shape—predict shape from uniformness of four neighbours and old shape.

Deltas—predict mini-block codeword differences from uniformness of this mini-block and old mini-block in time.

Datarate Reductions

Various simple but effective datarate reduction methods are employed. Noise in the input signal can lead to isolated small changes over the image, whose loss would not be noticed. Isolated changed mini-blocks are generally left out from the bitstream, though if the mini-block is sufficiently different they can still be updated. In addition, small changes in colour in high colour areas are generally ignored as these are almost always caused by noise.

Multi-Level Gap Masks: 4×4, 16×16, 64×64

The bulk of the images are represented mbs and gaps between them. The gaps are spatially and temporally correlated. The spatial correlation is catered for by dividing the image into 4×4 blocks of mbs, representing 64 pixels each, with one bit per mini-block representing whether the mbs has changed on this frame. These 4×4 blocks are grouped into 4×4 blocks of these, with a set bit if any of the mbs it represents have changed. Similarly, these are grouped into 4×4 blocks, representing 128×128 pixels, which a set bit if any of the pixels has changed in the compressed representation. It turns out that trying to predict 16 bits at a time is too ambitious as the system does not have time to learn the correct distributions in a video of typical length. Predicting the masks 4×2 pixels at a time works well. The context for this is the corresponding gap masks from the two previous frames. The transition infrastructure above then gives efficient codewords for the gaps at various scales.

Multiple Datarates at Once

One of the features of internet or intranet video distribution is that the audience can have a wide range of receiving and decoding equipment. In particular the connection speed may vary widely. In a system such as this designed for transmission across the internet, it helps to support multiple datarates. So the compression filters the image once, then resamples it to the appropriate sizes involving for example cropping so that averaging pixels to make the final image the correct size involves averaging pixels in rectangular blocks of fixed size. There is a sophisticated datarate targeting system which skips frames independently for each output bitstream. The compression is sufficiently fast on a typical modern PC of this time to create modem or midband videos with multiple target datarates. The video is split into files for easy access, and these files may typically be 10 seconds long, and may start with a key frame. The player can detect whether its pre-load is ahead or behind target and load the next chunk at either lower or higher datarate to make use of the available bandwidth. This is particularly important if the serving is from a limited system where multiple simultaneous viewers may wish to access the video at the same time, so the limit to transmission speed is caused by the server rather than the receiver. The small files will cache well on a typical internet setup, reducing server load if viewers are watching the video from the same ISP, office, or even the same computer at different times.

Key Frames

The video may be split into a number of files to allow easy access to parts of the video which are not the beginning. In these case, the files may start with a key frame. A key frame contains all information required to start decompressing the bitstream from this point, including a cut-style video frame and information about the status of the transition tables, such as starting with completely blank tables.

Digital Rights Management

DRM is an increasingly important component of a video solution, particularly now content is so readily accessible of the internet. Data typically included in DRM may an expiry data for the video, a restricted set of URLs the video can be played from. Once the compressor itself is sold, the same video may be compressed twice with different DRM data in an attempt to crack the DRM by looking at the difference between the two files. The compression described here is designed to allow small changes to the initial state of the transition or global compression tables to effectively randomise the bitstream. By randomizing a few bits each time a video is compressed, the entire bitstream is randomized each time the video is compressed, making it much harder to detect differences in compressed data caused by changes to the information encoded in DRM.

Miscellaneous

The Y values for each pixel within a single super-block can also be approximated. In many cases, there is only one or part of one object in a super-block. In these cases, a single Y value is often sufficient to approximate the entire super-block's pixel Y values, particularly when the context of neighbouring super-blocks is used to help reconstruct the image on decompression.

In many further cases, there are only two or parts of two objects in a super-block. In these cases, a pair of Y values is often sufficient to approximate the entire super-block's Y values, particularly when the context of the neighbouring super-blocks is used to help reconstruct the image on decompression. In the cases where there are two Y values, a mask is used to show which of the two Y values is to be used for each pixel when reconstructing the original super-block. These masks can be compressed in a variety of ways, depending on their content, as it turns out that the distribution of masks is very skewed. In addition, masks often change by small amounts between frames, allowing the differences between masks on different frames to be compressed efficiently.

Improvements to image quality can be obtained by allowing masks with more than two Y values, although this increases the amount of information needed to specify which Y value to use.

SPECIFIC DESCRIPTION

Figure 1:
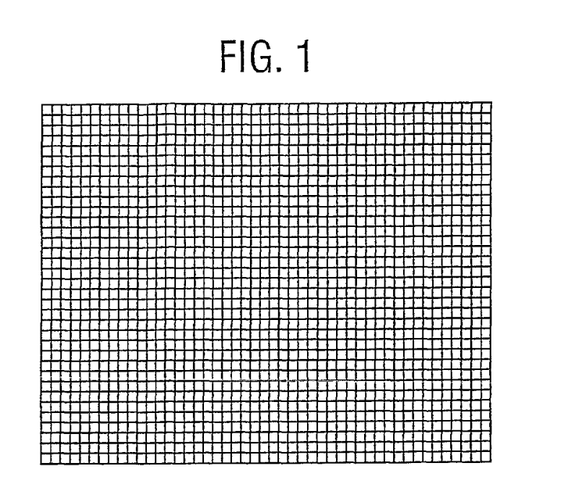
FIG. 1 shows a typical image of 376×280 pixels divided into 8×8 pixel super-blocks.
Figure 2:
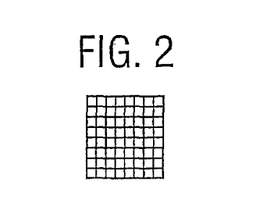
FIG. 2 shows a typical super-block of 8×8 pixels divided into 64 pixels.
Figure 3:
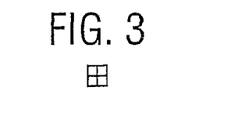
FIG. 3 shows a typical mini-block of 2×2 pixels divided into 4 pixels.
Figure 4:
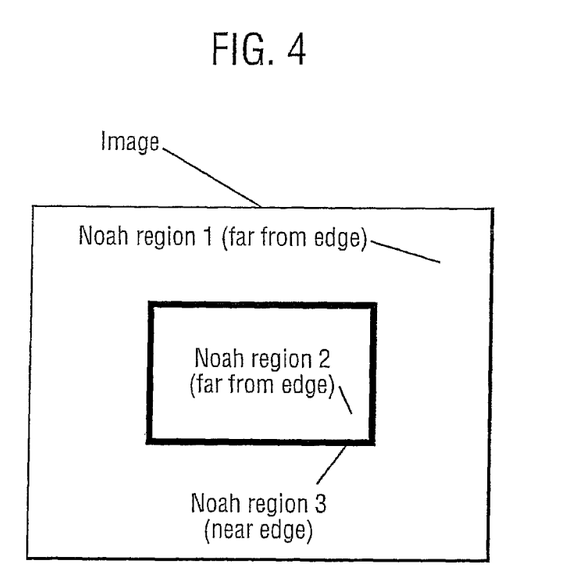
FIG. 4 shows an example image containing two Noah regions and a Noah edge.
Figure 5:
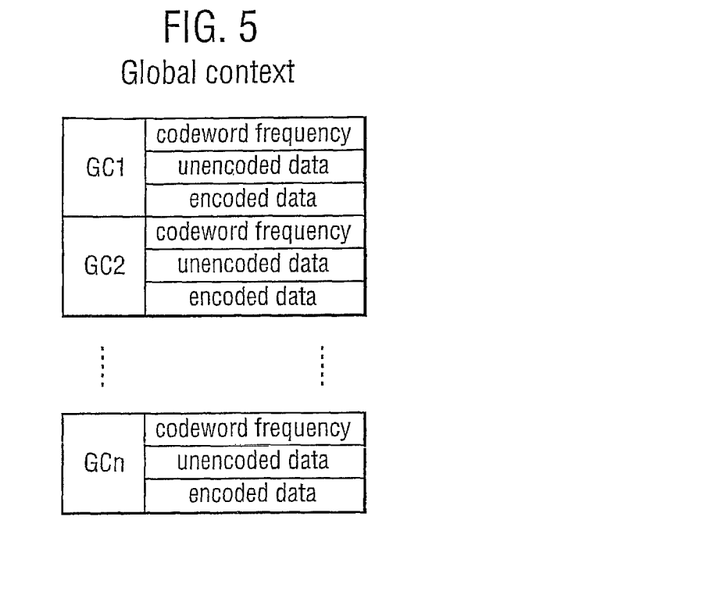
FIG. 5 shows an example of global accessible context for transition tables.
Figure 6:
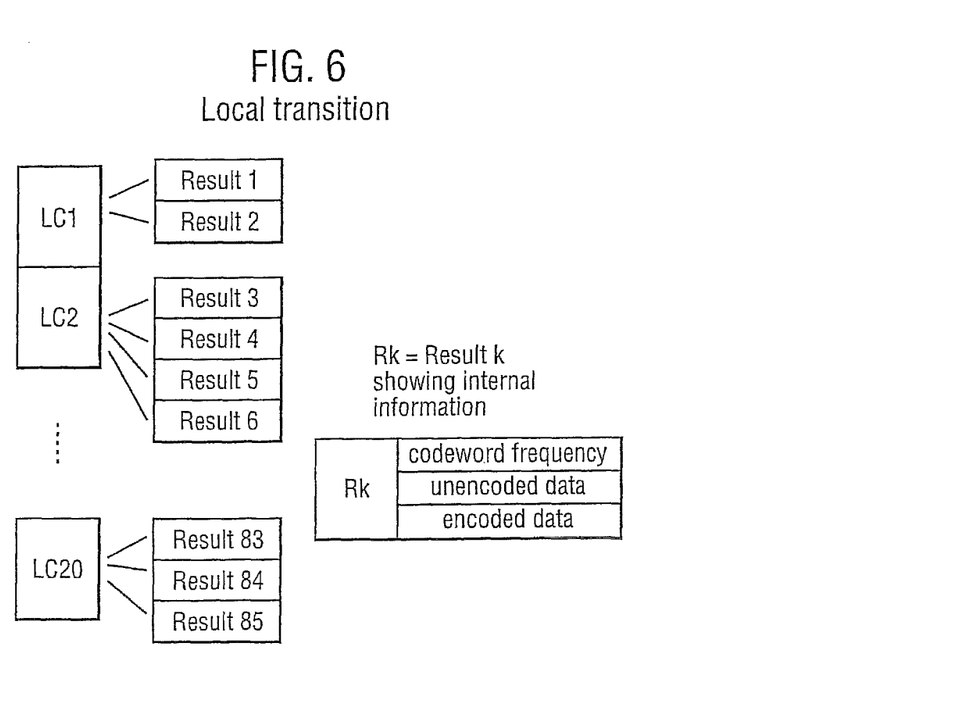
FIG. 6 shows an example of transition tables with local context (LC1 etc) and corresponding resulting values which have been predicted so far.
Figure 7:
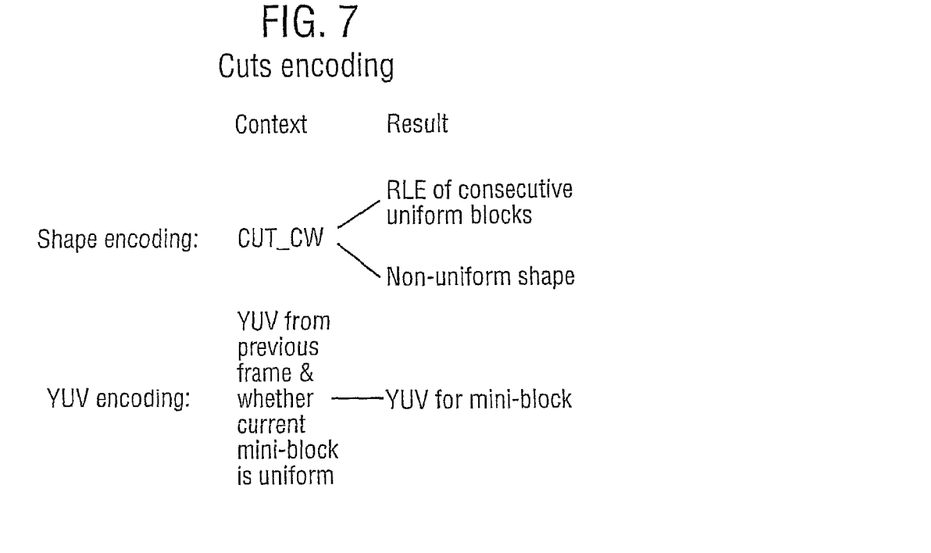
FIG. 7 shows the typical context information for cuts.
Figure 8:
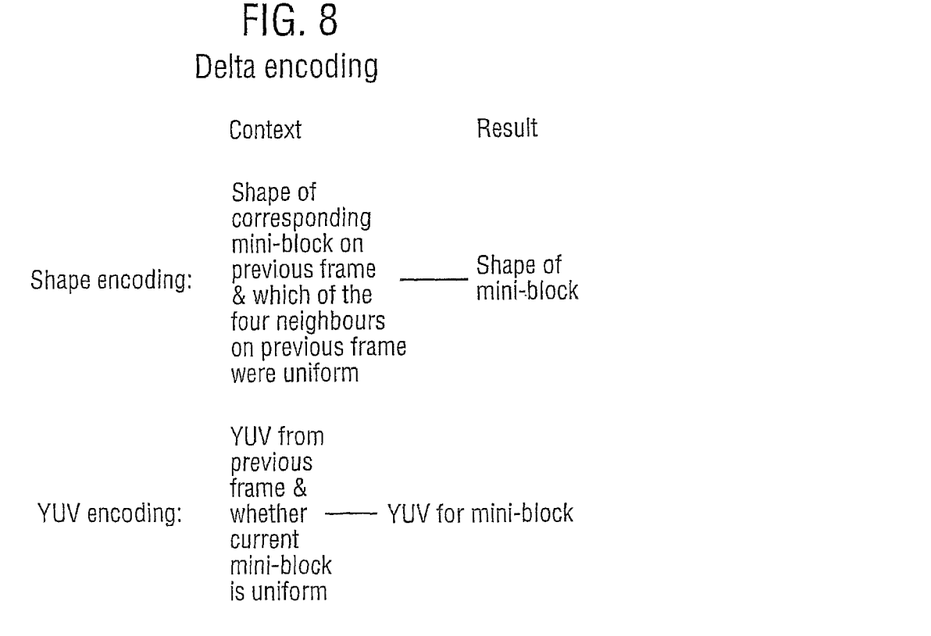
FIG. 8 shows the typical context information for delta frames.
Figure 9:
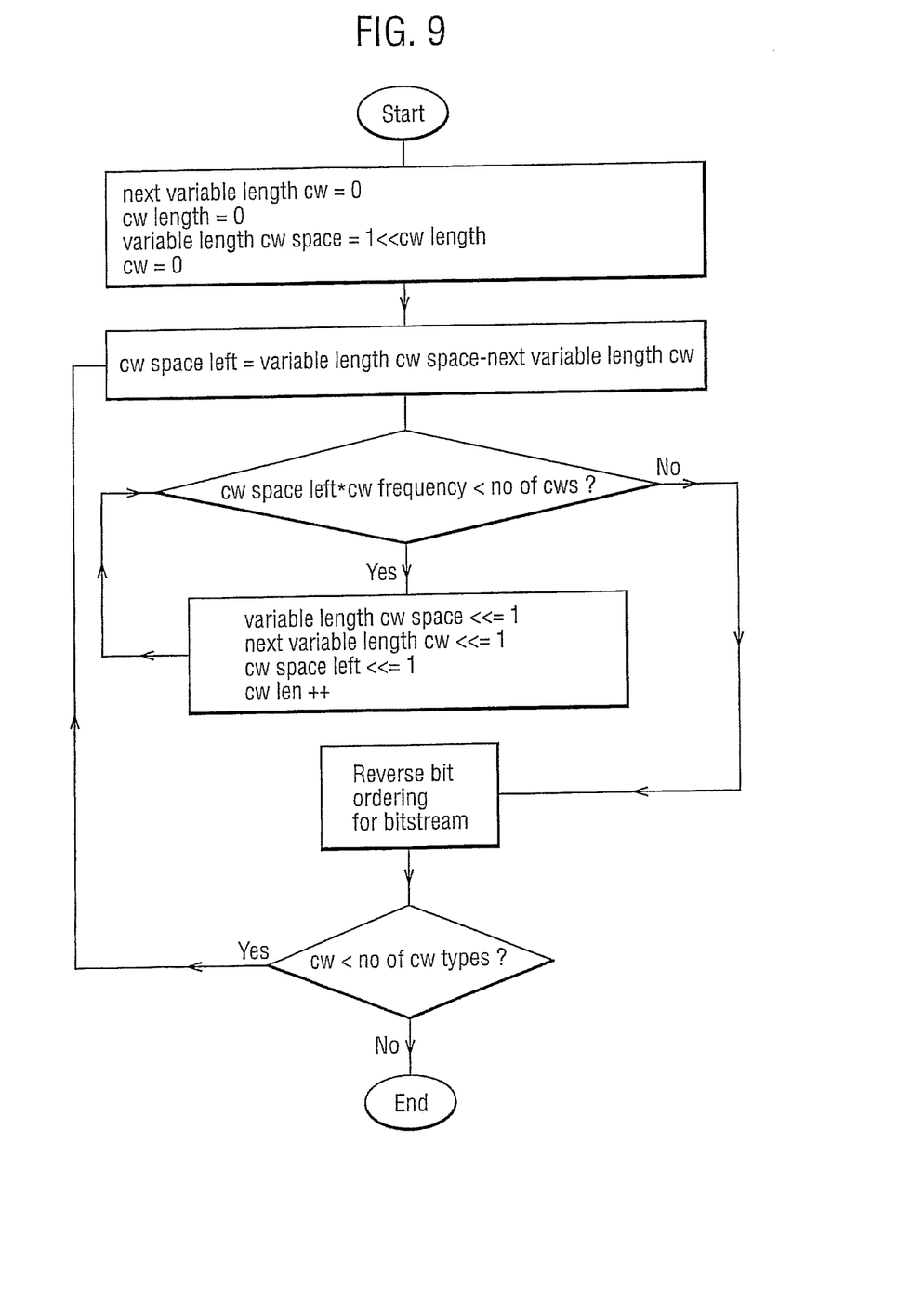
FIG. 9 is a flowchart showing how variable length codewords are generated from a list of codewords sorted by frequency.

Video frames of typically 384×288, 376×280, 320×240, 192×144, 160×120 or 128×96 pixels (see FIG. 1) are divided into pixel blocks, typically 8×8 pixels in size (see FIG. 2), and also into pixel blocks, typically 2×2 pixels in size, called mini-blocks (see FIG. 3). In addition, the video frames are divided into Noah regions (see FIG. 4), indicating how complex an area of the image is.

In one implementation, each super-block is divided into regions, each region in each super-block approximating the corresponding pixels in the original image and containing the following information:

1 Y values (typically 8 bits)
1 U value (typically 8 bits)
1 V value (typically 8 bits)
64 bits of mask specifying which YUV value to use when reconstructing this super-block.

In this implementation, each mini-block contains the following information:

2 Y values (typically 8 bits each)
1 U value (typically 8 bits)
1 V value (typically 8 bits)
4 bits of mask specifying which Y value to use when reconstructing this mini-block.

Temporal Gaps

If more latency is acceptable, temporal gaps rather than spatial gaps turn out to be an efficient representation. This involves coding each changed mini-block with a codeword indicating the next time (if any) in which it changes.

Interpolation Between Uniform Super-Blocks

Where uniform super-blocks neighbour each other, bilinear interpolation between the Y, and V values used to represent each block is used to find the Y, U and V values to use for each pixel on playback.

According to the invention there is provided a method of processing digital video information for transmission or storage after compression said method comprising:

reading digital data representing individual picture elements (pixels) of a video frame as a series of binary coded words;

segmenting the image into regions of locally relatively similar pixels and locally relatively distinct pixels;

having a mechanism for learning how contextual information relates to codewords requiring compression and encoding such codewords in a way which is efficient both computationally and in terms of compression rate of the encoded codewords and which dynamically varies to adjust as the relationship between the context and the codewords requiring compression changes and which is computationally efficient to decompress;

establishing a reduced number of possible luminance values for each block of pixels (typically no more than four);

encoding to derive from the words representing individual pixels further words describing blocks or groups of pixels each described as a single derived word which at least includes a representation of the luminance of a block component of at least eight by eight individual pixels (super-block);

establishing a reduced number of possible luminance values for each block of pixels (typically no more than four);

encoding to derive from the words representing individual pixels further words describing blocks or groups of pixels each described as a single derived word which at least includes a representation of the luminance of a block component of typically two by two individual pixels (mini-block);

establishing a reduced number of possible luminance values for each block of pixels (typically one or two);

providing a series of changeable stored masks as a means for indicating which of the possible luminance values are to be used in determining the appropriate luminance value of each pixel for display;

comparing and evaluating the words representing corresponding portions of one frame with another frame or frames in a predetermined sequential order of the elements making up the groups to detect differences and hence changes;

identifying any of the masks which require updating to reflect such differences and choosing a fresh mask as the most appropriate to represent such differences and storing the fresh mask or masks for transmission or storage;

using context which will be available at the time of decompression to encode the masks, the changes in Y values, U values, and V values, and the spatial or temporal gaps between changed blocks, combined with the efficient encoding scheme, to give an efficient compressed real time representation of the video;

using variable length codewords to represent the result of transitions in a way which is nearly optimal from a compression point of view, and computationally very efficient to calculate.

The invention claimed is:

1. A method of compressing digital data for storage or transmission, comprising the steps of:
   (i) reading inputted digital data as series of binary coded words representing a context and an input codeword to be compressed;
   (ii) calculating distribution output data for the inputted digital data and generating variable length prefix codewords for each combination of context and input codeword and generating a respective sorted transition table of variable length prefix codewords for each context, in a manner in which codeword space at the long end is left available to represent new input codewords, which have not yet occurred with corresponding contexts, as they occur; and
   (iii) repeating the process of step (ii) from time to time;
   (iv) whereby the inputted digital data can be subsequently replayed by recalculating the sorted transition table of local codewords at corresponding times in the inputted digital data.

2. A method according to claim 1 in which the codewords are recalculated for every new frame of data.

3. A method according to claim 2 in which some codeword space is reserved at each recalculation so as to allow successive new codewords to be assigned for data of lower frequency.

4. A method according to claim 1 in which some codeword space is reserved at each recalculation so as to allow successive new codewords to be assigned for data of lower frequency.

* * * * *